United States Patent [19]

Chang et al.

[11] Patent Number: 5,424,740
[45] Date of Patent: Jun. 13, 1995

[54] DIGITAL-TO-ANALOG CONVERTER WITH A JOHNSON CODE GENERATOR

[75] Inventors: Herman Chang, Hsinchu; Ning Chung-Ho, Tau-Ywan, both of Taiwan, Prov. of China

[73] Assignee: Holtek Microelectronics Inc., Hsinchu, Taiwan, Prov. of China

[21] Appl. No.: 105,856

[22] Filed: Aug. 11, 1993

[51] Int. Cl.⁶ .......................................... H03M 1/78
[52] U.S. Cl. ........................................ 341/147; 341/154
[58] Field of Search ............... 341/144, 147, 148, 154

[56] References Cited

U.S. PATENT DOCUMENTS

| | | | |
|---|---|---|---|
| 3,778,814 | 12/1973 | Dildy, Jr. | 341/147 |
| 3,995,267 | 11/1976 | Tripp | 341/144 |
| 4,368,432 | 1/1983 | Levy | 341/147 |
| 4,446,436 | 5/1984 | Ireland . | |
| 4,447,747 | 5/1984 | LaPotin | 341/147 |
| 4,512,029 | 4/1985 | Brice | 377/33 |
| 4,833,473 | 5/1989 | Dingwall | 341/154 |
| 5,065,159 | 11/1991 | Kuwana | 341/148 |
| 5,079,552 | 1/1992 | Pelgrom et al. | 341/148 |
| 5,126,740 | 6/1992 | Kawada | 341/147 |
| 5,200,751 | 4/1993 | Smith | 341/147 |

*Primary Examiner*—Howard L. Williams
*Attorney, Agent, or Firm*—Ladas & Parry

[57] ABSTRACT

A digital-to-analog converter includes a generator responsive to a digital input signal, a set of switches each being directly connected to the generator, and a first and a second terminals connecting therebetween a resistor device having a plurality of nodes directly connected to the switches in order that a node voltage can be obtained between one of the nodes and one of the terminals to serve as an analog signal. Such converter has a low distortion/noise and can be used in a broad source voltage scope.

12 Claims, 5 Drawing Sheets

|     | Q1 ~ Q16          | L1 ~ L16          |
|-----|-------------------|-------------------|
| T1  | 0000000000000000  | 1000000000000000  |
| T2  | 1000000000000000  | 0100000000000000  |
| T3  | 1100000000000000  | 0010000000000000  |
| T4  | 1110000000000000  | 0001000000000000  |
| T5  | 1111000000000000  | 0000100000000000  |
| T6  | 1111100000000000  | 0000010000000000  |
| T7  | 1111110000000000  | 0000001000000000  |
| T8  | 1111111000000000  | 0000000100000000  |
| T9  | 1111111100000000  | 0000000100000000  |
| T10 | 1111111110000000  | 0000001000000000  |
| T11 | 1111111111000000  | 0000010000000000  |
| T12 | 1111111111100000  | 0000100000000000  |
| T13 | 1111111111110000  | 0001000000000000  |
| T14 | 1111111111111000  | 0010000000000000  |
| T15 | 1111111111111100  | 0100000000000000  |
| T16 | 1111111111111110  | 1000000000000000  |
| T17 | 1111111111111111  | 0000000010000000  |
| T18 | 0111111111111111  | 0000000001000000  |
| T19 | 0011111111111111  | 0000000000100000  |
| T20 | 0001111111111111  | 0000000000010000  |
| T21 | 0000111111111111  | 0000000000001000  |
| T22 | 0000011111111111  | 0000000000000100  |
| T23 | 0000001111111111  | 0000000000000010  |
| T24 | 0000000111111111  | 0000000000000001  |
| T25 | 0000000011111111  | 0000000000000001  |
| T26 | 0000000001111111  | 0000000000000010  |
| T27 | 0000000000111111  | 0000000000000100  |
| T28 | 0000000000011111  | 0000000000001000  |
| T29 | 0000000000001111  | 0000000000010000  |
| T30 | 0000000000000111  | 0000000000100000  |
| T31 | 0000000000000011  | 0000000001000000  |
| T32 | 0000000000000001  | 0000000010000000  |
|     | FIG. 5            | FIG. 6            |

DIGITAL-TO-ANALOG CONVERTER WITH A JOHNSON CODE GENERATOR

BACKGROUND OF THE INVENTION

The present invention relates generally to a converter, and more particularly to a digital-to-analog converter. Generally speaking, an ordinary digital-to-analog converter includes sets of switches which are electrically connected to one another, a generator responsive to a digital input signal for controlling the set of switches, a set of resistors, and an output buffer. It is to be noticed that what kinds of circuit elements are chosen and how the elements are connected are the key points to the functions and effects of the digital-to-analog converter.

In the conventional digital-to-analog converter, the generator uses an up-counter or a down-counter resulting in a disadvantage that owing to the increased probability of introducing the signal glitch, the noise in the output analog signal is thus increased and the distortion is therefore increased. Taking the 4-bit up-counter for example, when the up-counter counts from 7 (with a binary representation 0111, i.e., bit4=0, bit3=bit2=bit1=1) to 8 (with a binary representation 1000, i.e., bit4=1, bit3=bit2=bit1=0), bit4 changes from 1 to 0, and bit3, bit2, and bit1 change from 0 to 1. Because of the propagation delay (the time delay), there are undesired transient states such as 0110, 0100, 0010 . . . etc. generated between 0111 and 1000. Therefore, if the seventh switch is set to be on and the other switches are set to be off when the counter counts 7 and if the eighth switch is set to be on and the other switches are set to off when the counter counts 8, some switches will be undesiredly turned on because of the undesired transient states resulting in some undesired noise being introduced to the converter output. Therefore, the output quality of the digital-to-analog converter is seriously affected.

Moreover, the conventional digital-to-analog converter chiefly uses NMOS switches or PMOS switches. Because the NMOS switch is turned on under a signal ranging from $V_{DD}$(the power supply) minus $V_{TN}$(the NMOS threshold voltage) to $V_{SS}$(a ground voltage), the NMOS switch cannot be turned on under a signal ranging from $V_{DD}$ minus $V_{TN}$ to $V_{DD}$. Similarly, the PMOS switch is turned on under a signal ranging from $V_{TP}$(the PMOS threshold voltage) to $V_{DD}$, so the PMOS cannot be turned on under a signal ranging from $V_{SS}$ to $V_{TP}$. That is to say, owing to a smaller working range of PMOS or NMOS, some signals which are partly not in said range will be cut off, so the distortion is seriously caused.

And further, the equivalent resistance of every switch is an important factor affecting the quality of the output signal. When the equivelant resistance is higher, the distortion is more serious, and vice versa. According to the conventional digital-to-analog converter, the equivalent resistance of the PMOS switches or the NMOS switches will vary as the applied power supply varies, so there will be different performances of the output signal because of the different applied power supplies. Taking the NMOS switch for example, the equivalent resistance is increased when the power supply VDD is decreased, and the equivalent resistance is decreased when the power supply VDD is increased. So, the PMOS switch or the NMOS switch performs differently when the different power supply is applied.

Furthermore, the PMOS switches or the NMOS switches are electrically connected to an output buffer which is strictly selected to meet the demand of impedance matching. Because the turn-on ranges of NMOS switches and PMOS switches are both narrow and are different to each other, and because the input common mode range of an operational amplifier is to be considered, it is better that an operational amplifier using an N-channel input differential amplifier is chosen to be the output buffer when the PMOS switches are applied and an operational amplifier using a P-channel input differential amplifier is chosen to be the output buffer when the NMOS switches are applied. Thus, the choice of a buffer means is restricted.

U.S. Pat. No. 4,446,436 entitled CIRCUIT FOR GENERATING ANALOG SIGNALS discloses a digital-to-analog converter. According to FIG. 1 thereof, the node (tap) voltages of the set of resistors are connected to the output through three sets of switches. Because the equivalent resistance of the switch is an important factor determining the distortion, when the equivalant resistance is higher, the distortion resulting from the noise is thus more serious, i.e., the more sets of the switches are used, the more distortion is generated. The equivalent resistance of the three sets of switches according to FIG. 1 is in such a situation that the converter is much mare prone to suffer the distortion problem. Besides, the performance of the applied NMOS switches such as T1-T16 is prone to be affected by the different applied power supply. It is therefore attempted by the Applicant to deal with the above situation encountered by the prior art.

SUMMARY OF THE INVENTION

The primary object of the present invention is to provide a digital-to-analog converter specially suitable for the applied power supply with a large power range.

Another object of the present invention is to provide a digital-to-analog converter with a low distortion. A further object of the present invention is to provide a digital-to-analog converter with a low noise.

In accordance with the present invention a digital-to-analog converter includes a generator responsive to a digital input signal for generating a control signal, a set of switches each being directly electrically connected to the generator for responding the control signal, a first and a second power terminals adapted to be electrically connected to a power source, and a resistor means electrically connected between the power terminals and having a plurality of nodes (taps) directly electrically connected to the set of switches in order that a node voltage can be obtained between one of the taps and one of the power terminals to serve as an analog signal.

Certainly, the plurality of nodes can be respectively electrically connected to the set of switches. The node voltage can be obtained through one of the switches. The resistor means can include resistors connected in series. The generator can include a decoder.

Certainly, the control signal can be decoded from a Gray code. The Gray code can be generated by a Johnson counter. The Johnson counter can consist of at least a flip-flop. Certainly, each of the switches can include a CMOS transmission gate. The CMOS transmission gate can include a PMOS connected in parallel with an NMOS.

Certainly, the digital-to analog converter further can comprise an output buffer electrically connected to the set of switches. The buffer can be an operational amplifier using an N-channel input differential amplifier. Alternatively, the buffer can be an operational amplifier using a P-channel input differential amplifier. The analog signal can be a sinewave.

The present invention can be more fully understood by reference to the following description and accompanying drawings, which form an integral part of this application.

BRIEF DESCRIPTION OF THE DRAWINGS

FIG. 5 shows a Gray code generated from a Johnson counter according to the present invention; and FIG. 6 shows a control signal obtained from a Johnson code decoded by a decoder according to the present invention.

DETAILED DESCRIPTION OF THE PREFERRED EMBODIMENTS

Figure 1:
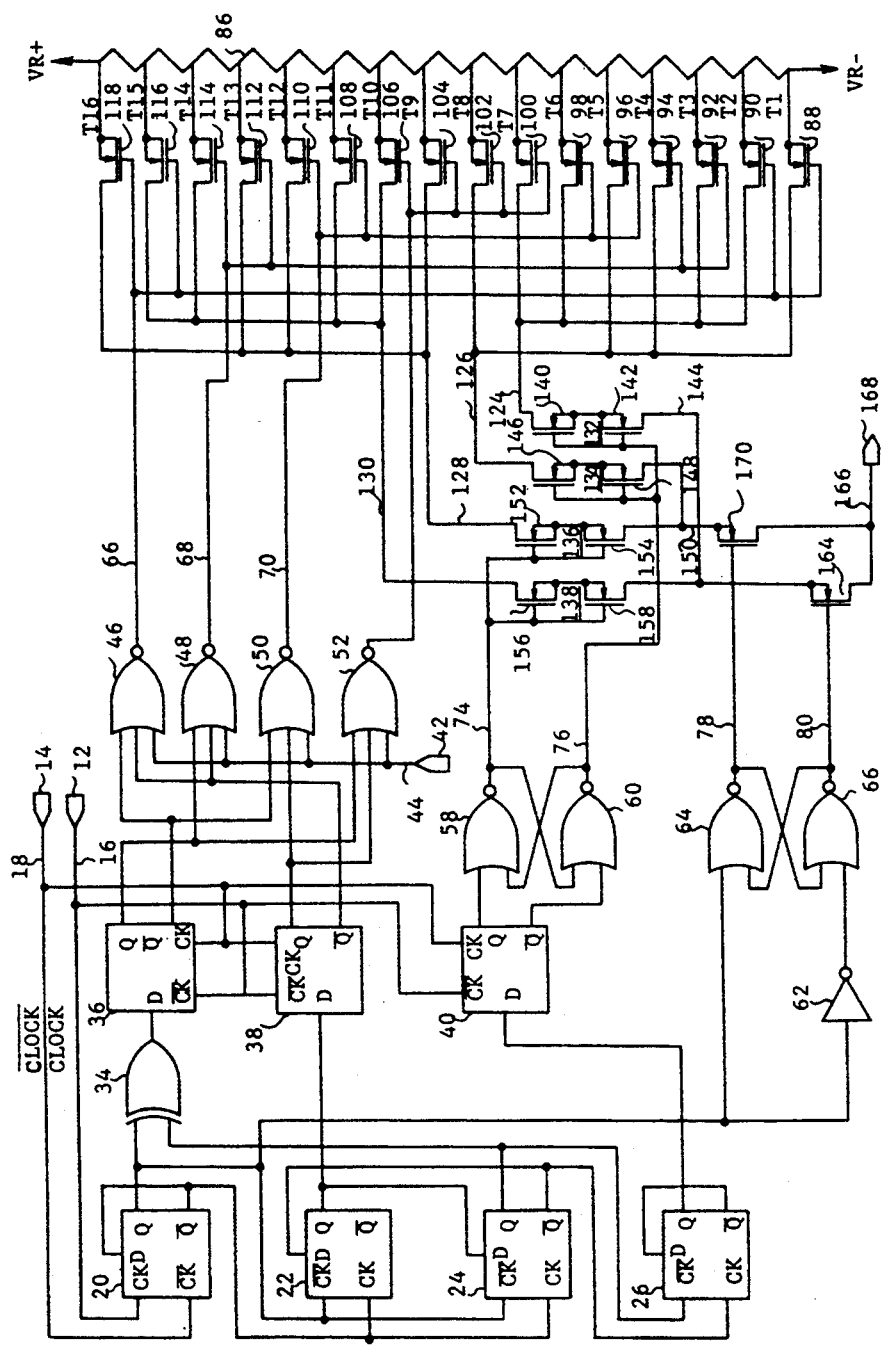
FIG. 1 shows a schematic logic circuit according to U.S.A. Pat. No. 4,446,436 entitled CIRCUIT FOR GENERATING ANALOG SIGNALS.
Figure 2:
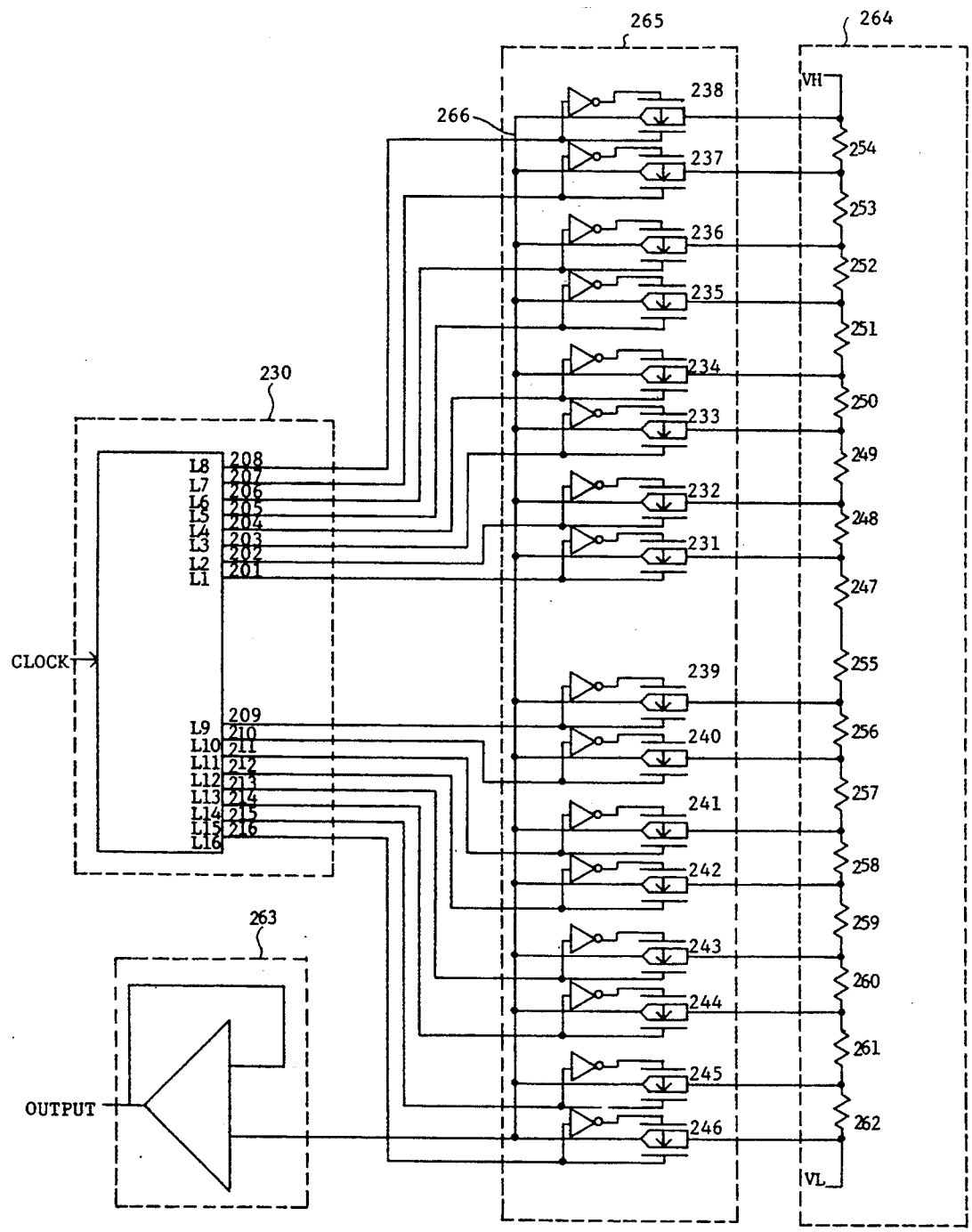
FIG. 2 shows a schematic logic circuit according to the present invention.

A digital-to-analog converter schematical logic circuit according to the present invention is depicted in FIG. 2. The present converter includes a generator 230, a set of switches 265 being CMOS transmission gates 231–246, and a resistor means 264. The generator 230 has outputs 201–216 which are respectively electrically connected to the CMOS transmission gates 231–246, respectively which in turn are, electrically connected to resistors 247–262 making up the resistor means 264 having a first terminal $V_H$ and a second terminal $V_L$. The CMOS transmission gates 231–246 are electrically connected to a wire 266 which is also electrically connected to an output buffer 263.

Figure 3:
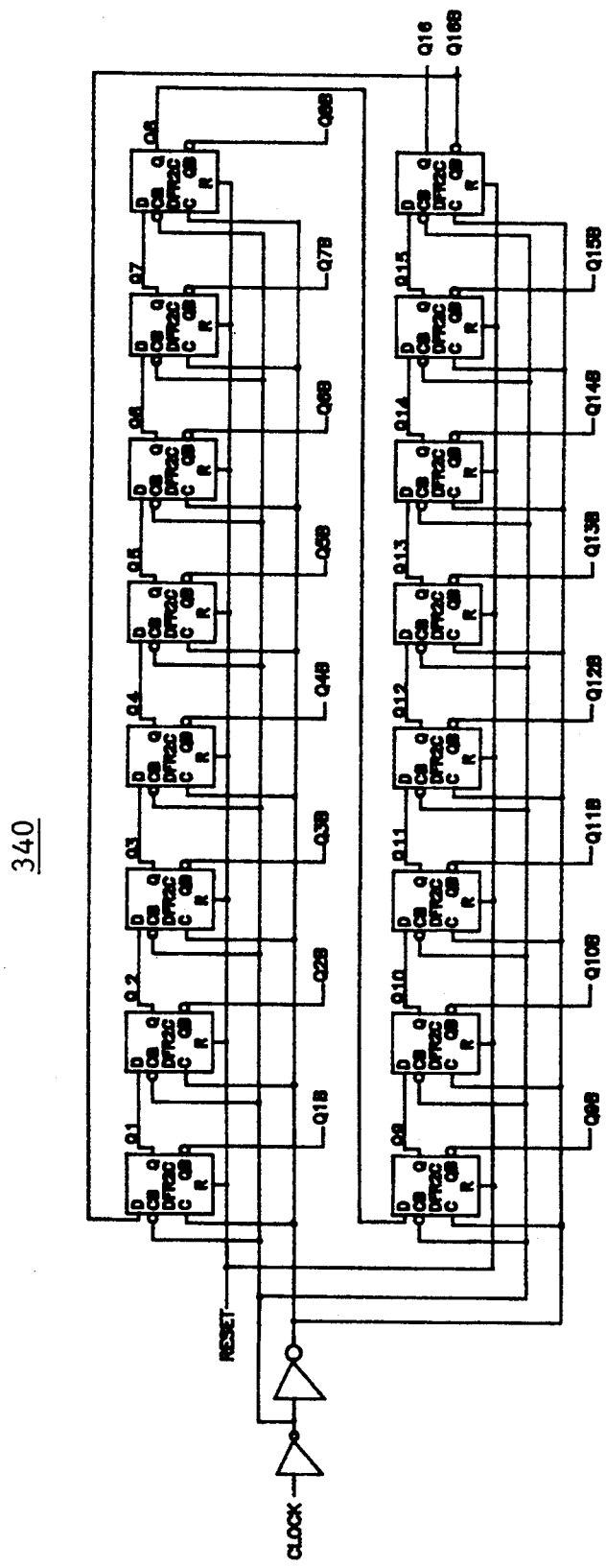
FIG. 3 shows a schematic logic circuit of a Johnson counter in a generator according to the present invention.
Figure 4:
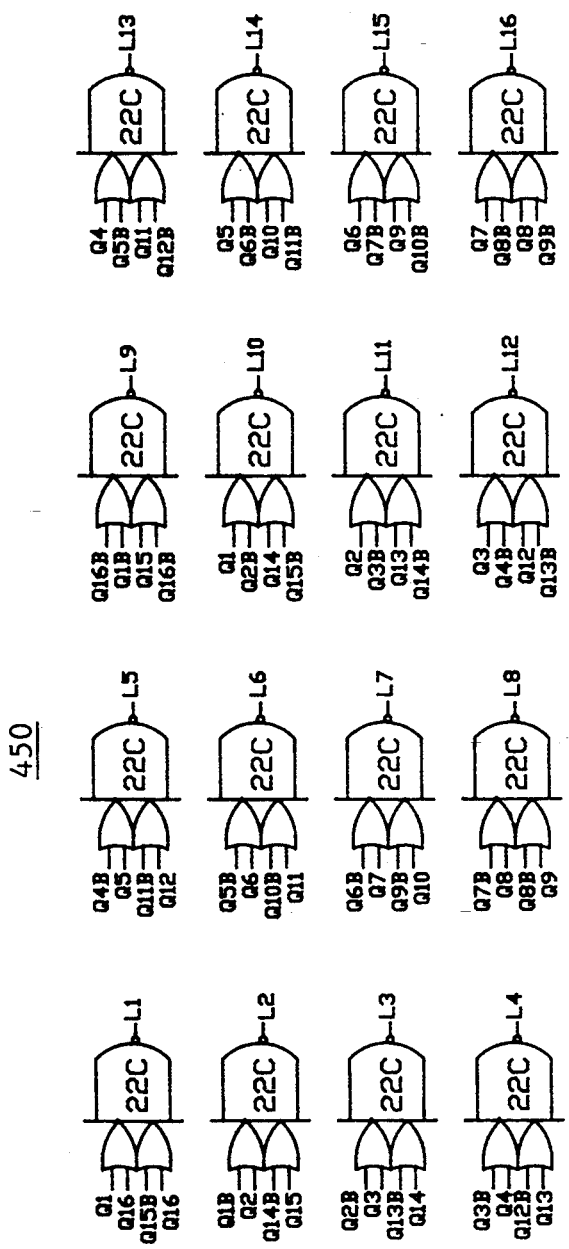
FIG. 4 shows a schematic logic circuit of a decorder in a generator according to the present invention.

Referring to FIGS. 3 & 4, the geneator 230 includes a Johnson counter 340 and a decoder 450, and the Johnson counter 340 is made up of 16 flip-flops. When a digital signal is input into the generator 230, the Johnson counter 340 encodes the digital signal into a Joynson code Q1–Q16 (as shown in FIG. 5), and the decoder 450 decodes the Johnson code Q1–Q16 into a control signal L1–L16 (as shown in FIG. 6).

The control signal L1–L16 will control the CMOS transmission gates 231–246. In other words, when every pulse of the digital signal is input into the generator 230, on bit of the obtained control signal is "1", and the other bits are all "0". Therefore, at any time there is only one certain node voltage obtained from the resistor means 264 to permit said voltage to be transmitted to the output buffer 263 through one of the transmission gates 231–246. By the different node voltages, an analog signal similar to a sine wave can be synthesized.

According to the present invention, the Johnson code Q1–Q16 generated from the Johnson counter 340, is decoded by the decoder 450 to obtain control signals L1–L16 controlling the transmission gates 231–246 to permit only one of the transmission gates 231–246 to be turned on at a specific time. Therefore, at any time, there is only one certain node voltage transmitted to the output terminal, and it is prevented that the undesired node volages are transmitted to the output terminal due to the undesired transient states to cause the distortion.

Further, according to the present invention, the certain node voltage is transmitted to the buffer 263 through only one CMOS transmission gate, so the distortion caused by the equivalent resistance of the CMOS transmission gate is thus smaller than that of at least two connected switches.

And further, according to the present invention, each of CMOS transmission gates 231–246 individually consists of a PMOS and an NMOS. Because the equivalent resistance of the transmission gate is hardly affected by the different applied power supplies, the output signal performs almost the same in spite of the different applied power supplies.

Besides, the turn-on range of the CMOS transmission gate is much wider than that of a PMOS switch or an NMOS switch, so the distortion caused by a signal which is cut off is therefore decreased.

While the present invention has been described in connection with what is presently considered to be the most practical and preferred embodiment, it is to be understood that the invention is not to be limited to the disclosed embodiments but on the contrary, is intended to cover various modifications and equivalent arragements included within the spirit and scope of the appended claims which scope is to be accorded the broadest interpretation so as to encompass all such modifications and equivalent structures.

What is claimed is:

1. A low distortion digital-to-analog converter comprising:

a generator responsive to a digital input signal which is encoded into Johnson code for generating a control signal decoded from said Johnson code, said control signal decoded from said Johnson code including a plurality of digital bits, only one bit of which is different from other bits of said plurality of digital bits;

a set of switches each being directly electrically connected to said generator for responding to said control signal decoded from said Johnson code;

a first and a second power terminals adapted to be electrically connected to a power source; and a resistor means electrically connected between said power terminals, and having a plurality of nodes directly electrically connected to said set of switches in order that a node voltage can be obtained between one of said nodes and one of said power terminals in response to said only one bit being applied to one of said switches coupled to said one of said nodes, said node voltage to serve as an analog signal.

2. The low distortion digital-to-analog converter according to claim 1 wherein each one of said plurality of nodes is electrically connected to a corresponding one of said set of switches.

3. The low distortion digital-to-analog converter according to claim 2 wherein said Johnson code generated by a Johnson counter.

4. The low distortion digital-to-analog converter according to claim 3 wherein said Johnson counter consists of at least a flip-flop.

5. The low distortion digital-to-analog converter according to claim 1 wherein said generator includes a decoder for decoding said Johnson code into said control signal.

6. The low distortion digital-to-analog converter according to claim 1 wherein each of said switches includes a CMOS transmission gate.

7. The low distortion digital-to-analog converter according to claim 6 wherein said CMOS transmission gate includes a PMOS connected in parallel with an NMOS.

8. The low distortion digital-to-analog converter according to claim 1 wherein said resistor means includes resistors connected in series.

9. The low distortion digital-to-analog converter according to claim 1, further comprising an output buffer electrically connected to said set of switches.

10. The low distortion digital-to-analog converter according to claim 9 wherein said buffer is an operational amplifier using an N-channel input differential amplifier.

11. The low distortion digital-to-analog converter according to claim 9 wherein said buffer is an operational amplifier using a P-channel input differential amplifier.

12. The low distortion digital-to-analog converter according to claim 1 wherein said analog signal is a sinewave.

* * * * *